United States Patent
Malladi et al.

(10) Patent No.: US 11,921,638 B2
(45) Date of Patent: *Mar. 5, 2024

(54) FLASH-INTEGRATED HIGH BANDWIDTH MEMORY APPLIANCE

(71) Applicant: Samsung Electronics Co., Ltd., Suwon-si (KR)

(72) Inventors: Krishna T. Malladi, San Jose, CA (US); Hongzhong Zheng, Los Gatos, CA (US)

(73) Assignee: Samsung Electronics Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/833,219

(22) Filed: Jun. 6, 2022

(65) Prior Publication Data
US 2022/0300426 A1    Sep. 22, 2022

Related U.S. Application Data

(63) Continuation of application No. 15/481,147, filed on Apr. 6, 2017, now Pat. No. 11,397,687.
(Continued)

(51) Int. Cl.
*G06F 12/08* (2016.01)
*G06F 12/0866* (2016.01)
(Continued)

(52) U.S. Cl.
CPC ...... *G06F 12/0866* (2013.01); *G06F 12/0868* (2013.01); *G06F 12/0897* (2013.01);
(Continued)

(58) Field of Classification Search
CPC .. G06F 12/0866; G06F 12/0868; G06F 12/12; G06F 12/0897; G06F 2212/1041; G06F 2212/306; G06F 2212/225
See application file for complete search history.

(56) References Cited

U.S. PATENT DOCUMENTS

| | | |
|---|---|---|
| 7,777,330 B2 | 8/2010 | Pelley et al. |
| 8,335,894 B1 | 12/2012 | Rajan et al. |
| | (Continued) | |

FOREIGN PATENT DOCUMENTS

| | | |
|---|---|---|
| CN | 102667735 A | 9/2012 |
| CN | 103890688 A | 6/2014 |
| | (Continued) | |

OTHER PUBLICATIONS

Ashok K. Sharma, "Embedded Memories Designs and Applications," in Advanced Semiconductor Memories: Architectures, Designs, and Applications, IEEE, 2003, pp. 479-548, ch6.*
(Continued)

*Primary Examiner* — Pierre Michel Bataille
(74) *Attorney, Agent, or Firm* — Lewis Roca Rothgerber Christie LLP

(57) ABSTRACT

According to some embodiments of the present invention, there is provided a hybrid cache memory for a processing device having a host processor, the hybrid cache memory comprising: a high bandwidth memory (HBM) configured to store host data; a non-volatile memory (NVM) physically integrated with the HBM in a same package and configured to store a copy of the host data at the HBM; and a cache controller configured to be in bi-directional communication with the host processor, and to manage data transfer between the HBM and NVM and, in response to a command received from the host processor, to manage data transfer between the hybrid cache memory and the host processor.

20 Claims, 3 Drawing Sheets

Related U.S. Application Data

(60) Provisional application No. 62/450,507, filed on Jan. 25, 2017.

(51) Int. Cl.
*G06F 12/12* (2016.01)
*G06F 12/0868* (2016.01)
*G06F 12/0897* (2016.01)

(52) U.S. Cl.
CPC ...... *G06F 12/12* (2013.01); *G06F 2212/1041* (2013.01); *G06F 2212/225* (2013.01); *G06F 2212/283* (2013.01)

(56) References Cited

U.S. PATENT DOCUMENTS

| | | | |
|---|---|---|---|
| 8,355,284 | B2 | 1/2013 | Dudte et al. |
| 8,397,013 | B1 | 3/2013 | Rosenband et al. |
| 8,874,831 | B2 | 10/2014 | Lee et al. |
| 8,914,568 | B2 | 12/2014 | Chinnaswamy et al. |
| 9,087,846 | B2 | 7/2015 | Fai et al. |
| 9,170,948 | B2 | 10/2015 | Loh et al. |
| 9,269,700 | B2 | 2/2016 | Koopmans et al. |
| 9,286,991 | B1 | 3/2016 | Walker |
| 9,432,298 | B1 | 8/2016 | Smith |
| 9,804,801 | B2 | 10/2017 | Moon et al. |
| 10,134,471 | B2 | 11/2018 | Chinnaswamy et al. |
| 10,169,242 | B2* | 1/2019 | Lee ............... G06F 12/0868 |
| 10,838,865 | B2* | 11/2020 | Leidel ............... G06F 13/40 |
| 10,978,427 | B2 | 4/2021 | Li et al. |
| 2007/0069390 | A1 | 3/2007 | Chen et al. |
| 2010/0088466 | A1 | 4/2010 | Nakanishi |
| 2011/0069526 | A1 | 3/2011 | Schuette |
| 2011/0194326 | A1 | 8/2011 | Nakanishi et al. |
| 2013/0060999 | A1 | 3/2013 | Chiu et al. |
| 2013/0147043 | A1 | 6/2013 | Gonzalez et al. |
| 2014/0013132 | A1 | 1/2014 | Rochemont et al. |
| 2014/0181387 | A1 | 6/2014 | Poremba et al. |
| 2014/0181421 | A1 | 6/2014 | O'Connor et al. |
| 2014/0215129 | A1 | 7/2014 | Kuzmin et al. |
| 2014/0321189 | A1 | 10/2014 | Fai et al. |
| 2015/0205538 | A1 | 7/2015 | Motegi |
| 2015/0279828 | A1 | 10/2015 | Koopmans et al. |
| 2015/0324319 | A1 | 11/2015 | Leidel |
| 2016/0246710 | A1 | 8/2016 | Shimizu |
| 2017/0005056 | A1 | 1/2017 | Fai et al. |
| 2017/0133103 | A1 | 5/2017 | Kwon |
| 2017/0160955 | A1 | 6/2017 | Jayasena et al. |
| 2017/0177492 | A1* | 6/2017 | Loh ............... G06F 12/0895 |
| 2017/0352388 | A1 | 12/2017 | Jeddeloh et al. |
| 2018/0005670 | A1 | 1/2018 | Lee et al. |
| 2018/0113628 | A1 | 4/2018 | Roberts |
| 2018/0114773 | A1 | 4/2018 | Chiu et al. |
| 2018/0232310 | A1* | 8/2018 | Chang ............... G06F 12/0895 |
| 2018/0300265 | A1 | 10/2018 | Roberts |
| 2020/0326889 | A1 | 10/2020 | Norman et al. |

FOREIGN PATENT DOCUMENTS

| | | | | |
|---|---|---|---|---|
| CN | 105074918 A | | 11/2015 | |
| KR | 10-2015-0112076 A | | 10/2015 | |
| WO | WO-2013028849 A1 | * | 2/2013 | ......... G06F 12/0246 |
| WO | 2013/101209 A1 | | 7/2013 | |
| WO | 2016/048553 A1 | | 3/2016 | |
| WO | WO-2017105575 A1 | * | 6/2017 | ......... G06F 12/0811 |
| WO | WO-2018052546 A1 | * | 3/2018 | ......... G06F 12/0811 |

OTHER PUBLICATIONS

Niknam, S. et al., "Energy efficient 3D Hybrid processor-memory architecture for the dark silicon age," 2015 10th International Symposium on Reconfigurable Communication-centric Systems-on-Chip (ReCoSoC), 2015, pp. 1-8.

Meswani, M.R., et al., "Heterogeneous memory architectures: A HW/SW approach for mixing die-stacked and off-package memories," 2015 IEEE 21st International Symposium on High Performance Computer Architecture (HPCA), 2015, pp. 126-136.

Sha E. H.-, et al., "The Design and Implementation of a High-Performance Hybrid Memory File System," 2016 International Conference on Advanced Cloud and Big Data (CBD), 2016, pp. 316-321.

Bathen, L. A. D., et al., "Software Controlled Memories for Scalable Many-Core Architectures," 2012 IEEE International Conference on Embedded and Real-Time Computing Systems and Applications, 2012, pp. 1-10.

Lin, C. W. C., et al., "3D stacked packages with bumpless interconnect technology," IEEE/CPMT/SEMI 28th International Electronics Manufacturing Technology Symposium (IEMT 2003), San Jose, CA, USA, 2003, pp. 231-235.

Kirhata, T., et al., "Three-Dimensional Dynamic Random Access Memories Using Through-Silicon-Vias," in IEEE Journal on Emerging and Selected Topics in Circuits and Systems, vol. 6, No. 3, pp. 373-384, Sep. 2016.

Poremba, M., et al., "Destiny: A tool for modeling emerging 3D NVM and eDRAM caches," 2015 Design, Automation & Test in Europe Conference & Exhibition (DATE), Grenoble, France, 2015, pp. 1543-1546.

Sharma, Ashok K., "HighDensity Memory Packaging Technologies," in Semiconductor Memories: Technology, Testing, and Reliability, IEEE, 1997, pp. 412-449.

Zou, Qiaosha, et al., "Heterogeneous Architecture Design with Emerging 3D and Non-Volatile Memory Technologies", 2015 (6 pages).

Office Action dated May 19, 2022 for corresponding Korean Patent Application No. 10-2017-0164428 (6 pages).

* cited by examiner

FLASH-INTEGRATED HIGH BANDWIDTH MEMORY APPLIANCE

CROSS-REFERENCE TO RELATED APPLICATION(S)

This application is a continuation of U.S. patent application Ser. No. 15/481,147, filed on Apr. 6, 2017, now patented as U.S. Pat. No. 11,397,687, which claims the benefit of and the priority to U.S. Provisional Patent Application No. 62/450,507 filed Jan. 25, 2017, the entire content of all of which are incorporated herein by reference.

FIELD

Aspects of the present invention relate to the field of data processing and retention systems.

BACKGROUND

Emerging applications like deep neural networks need massive amounts of high bandwidth memory to train on different datasets and learn with high accuracy. Neural networks are increasingly becoming complex and deep, resulting in an enormous increase of intermediate datasets that need to be held in paged memory. Recent approaches propose employing hundreds to thousands of machines to train networks with dozens of layers and millions, or even billions, of connections. The computations involved in these emerging applications can often be performed more efficiently on graphical processing unit (GPU) cores than on more traditional central processing unit (CPU) cores. However, the host may also be a field programmable gate array (FPGA) or an application-specific integrated circuit (ASIC) with dedicated local memory. Training such networks on a single GPU may be too slow (e.g., may take weeks or months) and training on a distributed set of GPUs can be inefficient, due to data movement overheads, stalled computation for data loading/offloading, limited bus bandwidth, and limited GPU memory due to through silicon via (TSV) packaging constraints.

The above information disclosed in this Background section is presently only for enhancement of understanding of the background of the invention, and therefore it may contain information that does not form the prior art that is already known to a person of ordinary skill in the art.

SUMMARY

Aspects of embodiments of the present invention are directed to an architecture of a processing device having a hybrid cache memory that integrates high bandwidth memory (HBM) with high capacity non-volatile memory dies (e.g., flash dies) to achieve both high bandwidth and high capacity. The processing device utilizes a cache controller on the logic die of HBM or in the module of the hybrid cache memory to efficiently perform data migration.

According to some embodiments of the present invention, there is provided a hybrid cache memory for a processing device having a host processor, the hybrid cache memory comprising: a high bandwidth memory (HBM) configured to store host data; a non-volatile memory (NVM) physically integrated with the HBM in a same package and configured to store a copy of the host data at the HBM; and a cache controller configured to be in bi-directional communication with the host processor, and to manage data transfer between the HBM and NVM and, in response to a command received from the host processor, to manage data transfer between the hybrid cache memory and the host processor.

According to some example embodiments, in response to receiving a write command from the host processor, the cache controller is configured to: determine that there is sufficient space within the HBM to store incoming host data; in response to the determination, store incoming host data in the HBM; and copy the stored host data to the NVM.

According to some example embodiments, in response to receiving a write command from the host processor, the cache controller is configured to: determine that there is insufficient space within the HBM to store incoming host data; in response to the determination, delete earliest accessed data stored at the HBM so as to create sufficient space within the HBM to accommodate storage of the incoming host data; store the incoming host data in the HBM; and copy the stored host data to the NVM.

According to some example embodiments, the cache controller is configured to copy the stored host data when not engaged in servicing a host command.

According to some example embodiments, the cache controller is configured to copy the stored host data to the NVM concurrently with the storing of the incoming host data in the HBM.

According to some example embodiments, the cache controller is integrated within the same package as the HBM and the NVM.

According to some example embodiments, the host processor is external to the package.

According to some example embodiments, the HBM comprises one or more stacks of HBM dies, the HBM dies of each of the one or more stacks being electrically coupled together through a plurality of through silicon vias (TSVs).

According to some example embodiments, the NVM comprises one or more NVM dies coupled to cache controller through a wire-bonded connection.

According to some example embodiments, the hybrid cache memory further includes a memory substrate positioned between, and configured to route electrical signals between, the cache controller and the NVM, and wherein the memory substrate is electrically coupled to the NVM through bonding wires, and is electrically coupled to the cache controller through pins, vias, or solder balls.

According to some example embodiments, the HBM exhibits higher data access bandwidth than the NVM, and the NVM exhibits greater data storage capacity than the HBM.

According to some example embodiments of the present invention, there is provided a processing device comprising: a host processor; and a hybrid cache memory in communication with the host processor, the hybrid cache memory comprising: a high bandwidth memory (HBM) configured to store host data; a non-volatile memory (NVM) physically integrated with the HBM in a same package and configured to store a copy of the host data at the HBM; and a cache controller configured to be in bi-directional communication with the host processor, and to manage data transfer between the HBM and NVM and, in response to a command received from the host processor, to manage data transfer between the hybrid cache memory and the host processor.

According to some example embodiments, the cache controller is integrated within the same package as the HBM and the NVM.

According to some example embodiments, the host processor is external to the package.

According to some example embodiments, the processing device further includes an interposer configured to physically support the host processor and the hybrid cache memory, and to electrically couple the host processor to the hybrid cache memory.

According to some example embodiments, the processing device further includes a package substrate electrically coupled to the interposer and configured to enable electrical communication between the host processor and components external to the processing device through a plurality of package pins.

According to some example embodiments of the present invention, there is provided a method of managing data transfer between a host processor and a hybrid cache memory of a processing device, the method comprising: in response to receiving a write command from the host processor, determining that there is insufficient space within a high bandwidth memory (HBM) of the hybrid cache memory to store incoming host data; in response to the determination, deleting earliest accessed data stored at the HBM so as to create sufficient space within the HBM to accommodate storage of the incoming host data; storing the incoming host data in a high bandwidth memory (HBM); and copying the stored host data to a non-volatile memory (NVM) of the hybrid cache memory, wherein the NVM is physically integrated with the HBM in a same package.

According to some example embodiments, the copying of the stored host data comprises copying the stored data to the NVM when the hybrid cache memory is not engaged in servicing a host command.

According to some example embodiments, the copying of the stored host data to the NVM is concurrent with the storing of the incoming host data in the HBM.

According to some example embodiments, the host processor is external to the package.

According to some example embodiments, the method further includes controlling, by the HBM, access of data areas in response to conflicting access requests of the data areas from host processor and a controller of the hybrid cache memory.

BRIEF DESCRIPTION OF THE DRAWINGS

The accompanying drawings, together with the specification, illustrate example embodiments of the present invention, and, together with the description, serve to explain the principles of the present invention.

DETAILED DESCRIPTION

Figure 1:
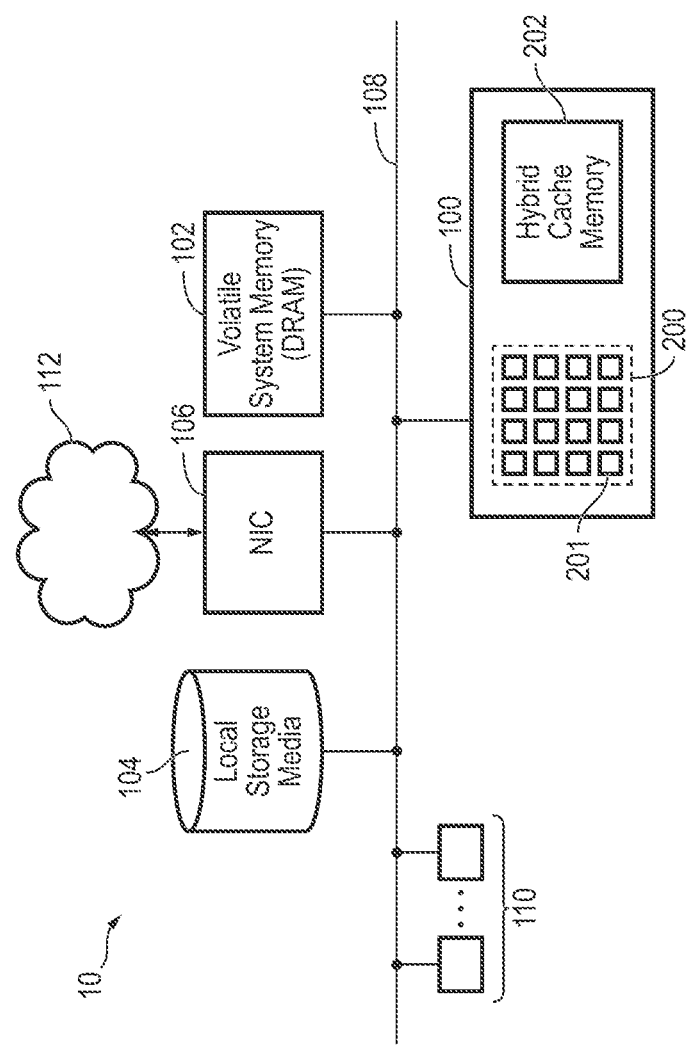
FIG. 1 is a block diagram of a computation system according to some embodiments of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Descriptions of features or aspects within each exemplary embodiment should typically be considered as available for other similar features or aspects in other exemplary embodiments. Like reference numerals designate like elements throughout the specification.

Aspects of embodiments of the present invention are directed to a hybrid cache memory for use in a processing device capable of reducing or eliminating the memory capacity bottlenecks of today's ever more complex algorithms. In some big data applications such as deep neural network (DNN) training, which is a very memory intensive process, paged memory may have predictable temporal behavior that lends well to caching. According to some embodiments of the present invention, the hybrid cache memory integrates high bandwidth memory (HBM) with high capacity non-volatile memory (e.g., flash dies) to achieve the best of both high bandwidth and high capacity without the overheads of multi-GPU/CPU solutions. In some embodiments, a cache controller on the logic die of the HBM or in the module along with the overall system architectural framework performs efficient data migration.

FIG. 1 is a block diagram of a computation system 10 according to some embodiments of the present invention.

Referring to FIG. 1, a computation system (e.g., a computer) 10 may include a processing device 100 communicatively coupled to a volatile system memory (e.g., dynamic random access memory or DRAM) 102, a local storage media 104, and a network interface controller (NIC) 106 via a data bus 108. The data bus 108 facilitates communication between the various peripheral components of the computation system 10, and be compatible with the peripheral component interconnect express (PCIe) standard or any other suitable bus standard. The NIC 106 may allow the computation system 10 (and its constituent components) to access, or be accessed by, an outside network (e.g., a wired and/or wireless network) 112, such as a local area network or the Internet.

In some embodiments, the processing device 100 includes a host (also referred to herein as a "host processor") 200 and a dedicated hybrid cache memory 202. The host 200 may include one or more graphic processing unit (GPU) cores 201; however, embodiments of the present invention are not limited thereto, and the host 200 may include one or more general central processing unit (CPU) cores, a field programmable gate array (FPGA), an application-specific integrated circuit (ASIC), or the like.

In addition to the processing device 100, the data bus 108 may be connected to one or more other processing devices 110, such as a plurality of CPU cores and/or the like. The processing device(s) 100/110 may continuously read instructions stored at the volatile system memory 102 and execute(s) them as required. Any data actively operated on may also be stored at the volatile system memory 102. The local storage media 104, which may include a hard disk drive (HDD) and/or a solid-state drive (SSD), may store resilient or permanent data.

Unlike the volatile system memory 102, which is external to and not integrated with the processing device(s) 100/110, the hybrid cache memory 202 is integrated with (e.g., is internal to or packaged within) the processing device 100 and acts as an intermediate stage between ultra-fast registers of the host 200 and the much slower volatile system memory 102. Due to its close proximity to the host 200 and the much higher data transfer bandwidth with the host 200, the hybrid cache memory 202 may be significantly faster than the volatile system memory 102, and may be used to store intermediate data being operated on by the host 200 and/or to store (e.g., store in duplicate form) the most actively used information in the volatile system memory 102.

According to some embodiments of the present invention, the hybrid cache memory 202 of the processing device 100 integrates high bandwidth memory (HBM) with high capacity non-volatile memory dies (e.g., flash dies), and is thus capable of concurrently exhibiting high bandwidth and high capacity storage, which are particularly desirable in applications such as deep neural network (DNN) training, and/or the like.

Figure 2:
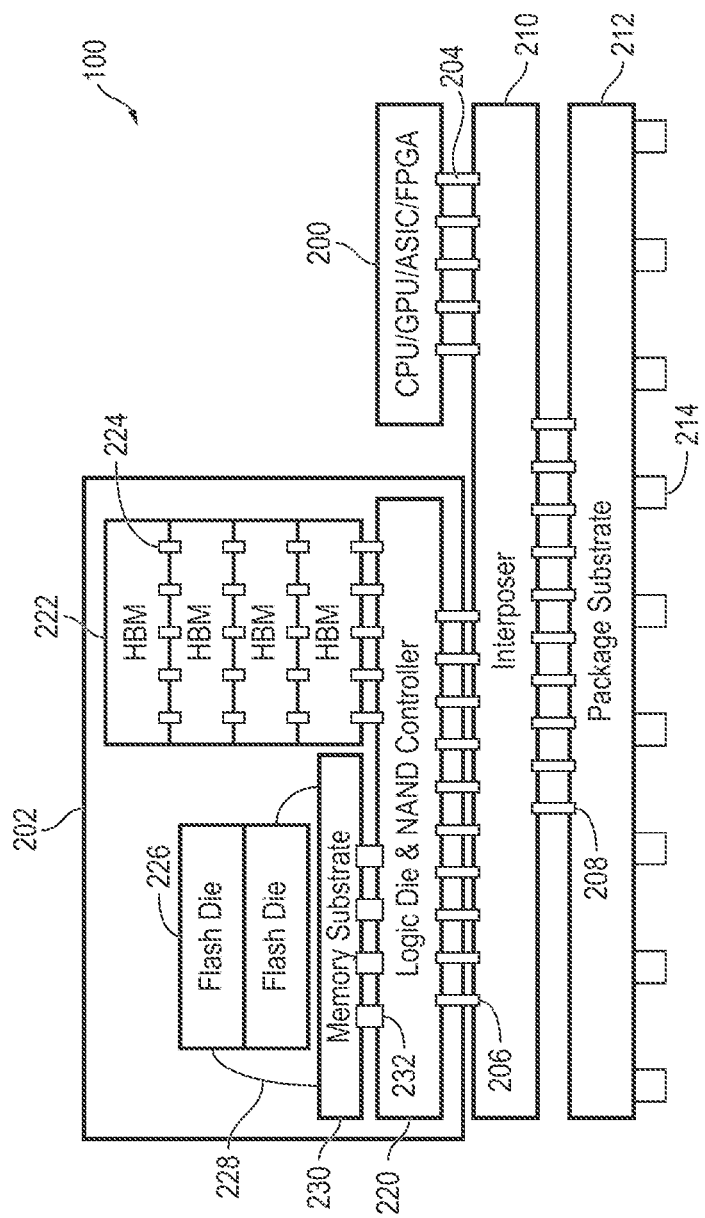
FIG. 2 is a schematic diagram of the architecture of the processing device according to some embodiments of the present invention.

FIG. 2 is a schematic diagram of the architecture of the processing device 100 according to some embodiments of the present invention.

Referring to FIG. 2, the host 200 and the hybrid cache memory 202 of the processing device 100 may be communicatively coupled to one another through a first and second set of vias 204 and 206 that are electrically interconnected by an interposer 210. The interposer 210 may physically support the host 200 and the hybrid cache memory 202 and allow them to electrically interface with one another though the first and second set of vias 204 and 206 and to electrically interface with peripheral components external to (e.g., outside the packaging of) the processing device 100 through the third set of vias 208, a package substrate 212, and package pins 214.

According to some embodiments, the hybrid cache memory 202 includes a cache controller 220, one or more stacks of high bandwidth memory (HBM) dies 222 that may be connected together using a plurality of vias (e.g., through silicon vias (TSVs)) 224 or microbumps, and one or more non-volatile memory dies (e.g., NAND flash dies) 226. In some embodiments, the one or more non-volatile memory dies 226 are physically and electrically integrated with the one or more stacks of HBM dies 222 within the same package, which may also include the cache controller 220. As illustrated, for example in FIG. 2, according to some example embodiments, the HBM dies 222 are stacked internally with respect to the hybrid cache memory 202, and the non-volatile memory dies 226 may be 3-dimensional NAND flash memory with multi-chip stacking (or string stacking). Additionally, as further illustrated in FIG. 2, according to some example embodiments, the logic die and NAND controller or cache controller 220 is implemented internally with respect to the hybrid cache memory 202, rather than being implemented as an external or separate component or device. Accordingly, as illustrated herein, embodiments of the present invention may include point to point links between the HBM dies 222 and the non-volatile memory dies 226 as opposed to independent connections with a controller. The host 200 may be external to (that is positioned outside of) the package that encapsulates the hybrid cache memory 202, which may improve thermal characteristics, testability, and improve capacity scaling.

In some examples (as shown in FIG. 2), each of the one or more non-volatile memory dies 226 may be configured for edge bonding, or direct through silicon via (TSV) stacking of the non-volatile memory dies 226. In such examples, the one or more non-volatile memory dies 226 may be communicatively coupled to the cache controller 220 through a memory substrate 230 that may be positioned between the cache controller 220 and the one or more non-volatile memory dies 226. The one or more non-volatile memory dies 226 may be connected to the memory substrate 230 using a plurality of bonding wires 228. The memory substrate 230 may route those connections to the cache controller 220 using a number of vias/solder balls 232. The combination of the bonding wires 228, the memory substrate 230 and the vias/solder balls 232 permit the flow of electrical power, control signals, and data signals between the cache controller 220 and the one or more non-volatile memory dies 226 when there is a mismatch in connection types of said components. However, embodiments of the present invention are not limited thereto, and the one or more non-volatile memory dies 226 may be electrically coupled to the cache controller 220 through any suitable means. For example, the one or more non-volatile memory dies 226 may be directly bonded to the cache controller 220 without the aid of the memory substrate 230.

As will be understood by a person of ordinary skill in the art, the vias 204, 206, 208, 224 and/or 232 may be replaced with any suitable connection means, such as solder bumps or the like.

In some embodiments, the cache controller 220 incorporates firmware logic allowing it to control (e.g., write to and read from) the one or more non-volatile memory dies 226 as well as the one or more stacks of HBM dies 222 (which may, e.g., be 1, 2, or 4 stacks of 2, 4, 8, or any suitable number of HBM dies). The cache controller 220 may maintain a hybrid logical-to-physical address table map (hybrid LtoP table), which tracks in what physical location of the one or more stacks of HBM dies 222 and/or the one or more non-volatile memory dies 226 each piece of stored data is located. The cache controller 220 may act as an interface block between the host 200 and the memory blocks within the hybrid cache memory 220 and, in some embodiments, may allow the host 200 to be blind to (e.g., be unaware of) the existence of the one or more non-volatile memory dies 226, while availing itself of the benefits provided by the one or more non-volatile memory dies 226.

In some examples, the cache controller 220 may perform inclusive hardware caching, whereby the one or more non-volatile memory dies 226 are utilized to store copies (e.g., backup copies) of all data stored at the one or more stacks of HBM dies 222. This may be performed as a background process, for example, when the cache controller 220 is not in the midst of writing to or reading from the one or more stacks of HBM dies 222. As HBM dies exhibit greater bandwidth (writing/reading speed) than non-volatile memory, incoming data from the host 200 may first be stored in the one or more stacks of HBM dies 222, and be subsequently backed-up at the one or more non-volatile memory dies 226. In such embodiments, when the cache controller 220 receives a write command from the host 200, if insufficient space exists within the one or more stacks of HBM dies 222, the cache controller 220 may, for example, delete older data or least frequently used data stored on HBM dies 222 so as to allocate sufficient space to accommodate incoming host data. No data may be lost in such a process as the one or more non-volatile memory dies 226 maintain a backup of all data written onto the HBM dies 222 (to the extent that the capacity of the one or more non-volatile memory dies 226 is not exceeded). In such embodiments, the host 200 may only be aware of the existence of the one or more stacks of HBM dies 222 in the hybrid cache memory 202 (and thus, be unaware of the existence of the one or more non-volatile memory dies 226). As the cache controller 220 hides any complexity introduced by the addition of the one or more non-volatile memory dies 226 from the host 200, the host 200 may communicate with the hybrid cache memory 202 in the same or substantially same manner as it would with a conventional cache memory. Further, in some examples, the pin out of the hybrid cache memory 202 may be the same as or substantially the same as a related art cache memory. Accordingly, in some embodiments, the hybrid cache memory 202 may be interchangeable with a standard cache memory (e.g., in terms of both hardware and software). This may allow the hybrid cache memory to be 'dropped in' to an existing system design without requiring any changes to the host or the overall computation system 10.

In some examples, the cache controller may perform exclusive caching, whereby incoming host data may be stored in only one of the one or more stacks of HBM dies 222 or the one or more non-volatile memory dies 226, but not both. In such embodiments, the cache controller 220 may maintain exclusivity by exchanging the relevant memory line with another algorithmically chosen line between the HBM 222 and the non-volatile memory 226 upon a cache hit. Upon cache miss in the HBM 222, the cache controller may access the non-volatile memory die 226 to obtain the data line. Thus, embodiments of the present invention may increase effective memory capacity due, for example, to a single core hierarchy without bus-snooping based cache-invalidation of multi-core caches where inclusive caching may be easier to implement.

According to some embodiments, the cache controller 220 utilizes either GPU assist (or) GPU-HBM asynchronous interface to schedule data migration between one or more stacks of HBM 222 and one or more non-volatile memory dies 226. In the case of inclusive caching, data copying occurs between the HBM and non-volatile (e.g., flash) memory areas. In the case of exclusive caching, data exchange occurs between the memory areas. In both cases, the HBM logic die controller schedules the data movement, while avoiding a conflict with host (e.g., GPU, FPGA, ASIC) scheduled accesses to the same memory address/banks in either the HBM or the non-volatile memory. Conflicts may be avoided, for example, by enabling the host controller to completely control data migrations. Another mechanism for avoiding conflicts is to utilize an asynchronous host-memory interface. In the case of utilizing an asynchronous host-memory interface, because the protocol is transaction-based and does not have fixed timing, conflicts to the same memory areas (by the host and cache controller) are arbitrated by the HBM logic die and after performing both the operations, the HBM logic die can signal the appropriate response to the host.

Figure 3:
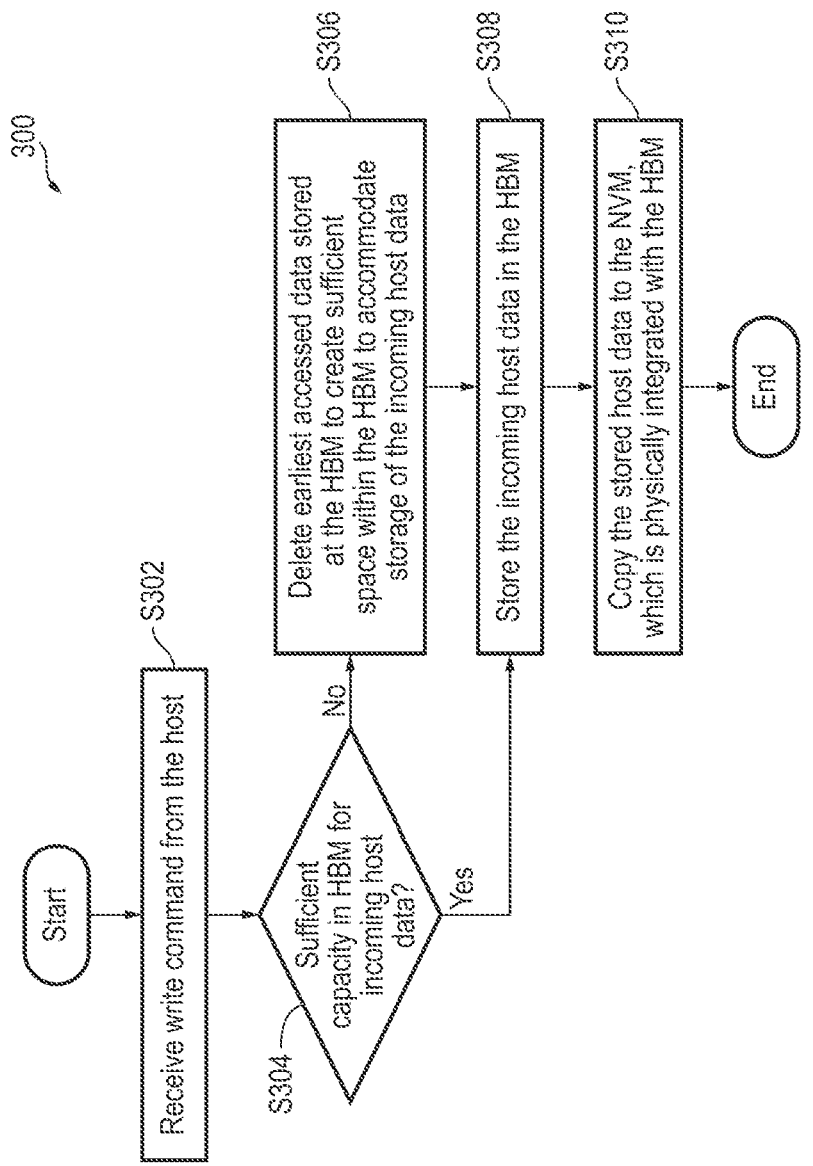
FIG. 3 is a flow diagram illustrating a process for managing data transfer between a host and a hybrid cache memory of the processing device, according to some embodiments of the present invention.

FIG. 3 is a flow diagram illustrating a process 300 for managing data transfer between the host 200 and the hybrid cache memory 202 of the processing device 100, according to some embodiments of the present invention.

Referring to FIG. 3, in act S302, the cache controller 220 receives a write command from the host 200.

In act S304, the cache controller 220 determines whether there is sufficient capacity within the one or more stacks of HBM 222 to store the incoming host data associated with the write command.

If there is insufficient space, in act S306, the cache controller 220 deletes the earliest (or least) accessed data stored at the one or more stacks of HBM 222 so as to create sufficient space within the one or more stacks of HBM 222 to accommodate storage of the incoming host data. The cache controller 220 then proceeds to act S308, where cache controller 220 stores the incoming host data in the one or more stacks of HBM 222. If in act 304, it is determined that there is sufficient space within the one or more stacks of HBM 222, the cache controller 220 may skip act 306 and proceed to act S308.

In act S310, the cache controller 220 then backs up the stored host data to the one or more non-volatile memory dies 226, which is physically integrated with the HBM in a same package. Thus, in some examples, the one or more non-volatile memory dies 226 store a copy of all data stored at one or more stacks of HBM 222, and even some older data that may have been previously deleted from the one or more stacks of HBM 222 by the cache controller 220 to create sufficient space for incoming host data.

In some embodiments, the cache controller 220 backs up the data content of the one or more stacks of HBM 222 to the one or more non-volatile memory dies 226 when the cache controller 220 is not engaged in servicing a host command, such as a host read or write command (e.g., due so when the hybrid cache memory 202 is in idle mode). In some examples, the backup may occur concurrently (e.g., simultaneously) with the writing of the incoming host data to the one or more stacks of HBM 222.

In performing any of acts S306, S308, and S310, the cache controller 220 updates a hybrid LtoP table to continuously track the physical location of the data being operated on (e.g., stored, moved, or deleted).

While the HBM dies 222 offer high throughput memory access to the host 200, the ability to increase memory by stacking more HBM dies or adding more stacks is substantially limited by the real estate and power constraints of the processing device 100. Non-volatile memory (e.g., flash memory) may be slower than HBM, however, it offers significantly more capacity (e.g., orders of magnitude more capacity) per unit area than HBM, and consumes less power. Thus, by integrating non-volatile memory with HBM within a single package, the hybrid cache memory 202, according to embodiments of the present invention, avails itself of the advantages of both types (kinds) of memory by achieving significantly greater (e.g., a 1000 times greater) capacity at lower power as compared to the cache memory of the related art. This alleviates the need to use multiple GPUs/CPUs or to use pooled virtualized host DRAM or HBM to run memory/processing intensive applications such as DNN training, which in turn reduces or eliminates unnecessary data movement between GPU/CPU and HBM and/or between multiple GPUs/CPUs, eases memory capacity bottlenecks, and in DNN applications, reduces training time, enables bigger batches, and larger algorithms and datasets.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on," "connected to," "coupled to," or "adjacent" another element or layer, it can be directly on, connected to, coupled to, or adjacent the other element or layer, or one or more intervening elements or layers may be present. When an element or layer is referred to as being "directly on," "directly connected to," "directly coupled to," or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, "use," "using," and "used" may be considered synonymous with the terms "utilize," "utilizing," and "utilized," respectively.

The computing system and/or any other relevant devices or components, such as the hybrid cache memory or processing device, according to embodiments of the present invention described herein may be implemented utilizing any suitable hardware, firmware (e.g. an application-specific integrated circuit), software, or a suitable combination of software, firmware, and hardware. For example, the various components of the processing device may be formed on one integrated circuit (IC) chip or on separate IC chips. Further, the various components of the processing device may be implemented on a flexible printed circuit film, a tape carrier package (TCP), a printed circuit board (PCB), or formed on a same substrate. Further, the various components of the data retention system may be a process or thread, running on one or more processors, in one or more computing devices, executing computer program instructions and interacting with other system components for performing the various functionalities described herein.

While this invention has been described in detail with particular references to illustrative embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims and equivalents thereof.

What is claimed is:

1. A hybrid cache memory for a processing device including a host processor, the hybrid cache memory comprising:
   a cache controller configured to be in bi-directional communications with the host processor;
   a first memory type arranged vertically on a side of the cache controller; and
   a second memory type arranged vertically on the same side of the cache controller as that of the first memory type, and arranged laterally with respect to the first memory type on the same side of the cache controller,
   wherein the cache controller is configured to control data transfer between the first memory type and the second memory type, and the cache controller, the first memory type, and the second memory type are encapsulated by and physically integrated with each other within a package, and
   wherein the cache controller is different from the host processor.

2. The hybrid cache memory of claim 1, wherein the host processor is external to the package encapsulating the hybrid cache memory.

3. The hybrid cache memory of claim 2, wherein the host processor and the hybrid cache memory are physically supported by and electrically connected to each other through an interposer.

4. The hybrid cache memory of claim 1, wherein the first memory type exhibits higher data access bandwidth than the second memory type.

5. The hybrid cache memory of claim 4, wherein the second memory type exhibits greater data storage capacity than the first memory type.

6. The hybrid cache memory of claim 1, wherein the cache controller is configured to copy host data from the first memory type to the second memory type.

7. The hybrid cache memory of claim 1, wherein the cache controller is configured to maintain a hybrid logical-to-physical address table map to track locations of data stored in the first memory type and in the second memory type.

8. The hybrid cache memory of claim 1, wherein the first memory type comprises a stack of high bandwidth memory (HBM) dies that are electrically coupled to each other through a plurality of through silicon vias (TSVs).

9. The hybrid cache memory of claim 1, wherein the second memory type comprises a stack of non-volatile memory (NVM) dies that are electrically connected to the cache controller through a wire-bonded connection.

10. The hybrid cache memory of claim 1, further comprising a memory substrate positioned between the cache controller and the second memory type to route electrical signals between the cache controller and the second memory type, the memory substrate being electrically connected to the second memory type by bonding wires, and electrically connected to the cache controller by pins, vias, or solder balls.

11. A processing device comprising:
    a host processor; and
    a hybrid cache memory comprising:
      a cache controller configured to be in bi-directional communications with the host processor;
      a first memory type arranged vertically on a side of the cache controller; and
      a second memory type arranged vertically on the same side of the cache controller as that of the first memory type, and arranged laterally with respect to the first memory type on the same side of the cache controller,
    wherein the cache controller is configured to control data transfer between the first memory type and the second memory type, and the cache controller, the first memory type, and the second memory type are encapsulated by and physically integrated with each other within a package, and
    wherein the cache controller is different from the host processor.

12. The processing device of claim 11, wherein the host processor is external to the package encapsulating the hybrid cache memory.

13. The processing device of claim 12, wherein the host processor and the hybrid cache memory are physically supported by and electrically connected to each other through an interposer.

14. The processing device of claim 11, wherein the first memory type exhibits higher data access bandwidth than the second memory type.

15. The processing device of claim 14, wherein the second memory type exhibits greater data storage capacity than the first memory type.

16. The processing device of claim 11, wherein the cache controller is configured to copy host data from the first memory type to the second memory type.

17. The processing device of claim 11, wherein the cache controller is configured to maintain a hybrid logical-to-physical address table map to track locations of data stored in the first memory type and in the second memory type.

18. The processing device of claim 11, wherein the first memory type comprises a stack of high bandwidth memory (HBM) dies that are electrically coupled to each other through a plurality of through silicon vias (TSVs).

19. The processing device of claim 11, wherein the second memory type comprises a stack of non-volatile memory (NVM) dies that are electrically connected to the cache controller through a wire-bonded connection.

20. The processing device of claim 11, further comprising a memory substrate positioned between the cache controller and the second memory type to route electrical signals between the cache controller and the second memory type, the memory substrate being electrically connected to the second memory type by bonding wires, and electrically connected to the cache controller by pins, vias, or solder balls.

* * * * *